(12) United States Patent
Li

(10) Patent No.: US 12,204,218 B2
(45) Date of Patent: Jan. 21, 2025

(54) DISPLAY PANEL AND DISPLAY DEVICE

(71) Applicant: Shenzhen China Star Optoelectronics Semiconductor Display Technology Co., Ltd., Guangdong (CN)

(72) Inventor: Wei Li, Shenzhen (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 0 days.

(21) Appl. No.: 17/623,602

(22) PCT Filed: Aug. 5, 2021

(86) PCT No.: PCT/CN2021/110901
§ 371 (c)(1),
(2) Date: Dec. 29, 2021

(87) PCT Pub. No.: WO2023/004864
PCT Pub. Date: Feb. 2, 2023

(65) Prior Publication Data
US 2024/0036417 A1 Feb. 1, 2024

(30) Foreign Application Priority Data
Jul. 29, 2021 (CN) .......................... 202110862225.8

(51) Int. Cl.
*G02F 1/1362* (2006.01)
*G02F 1/1343* (2006.01)
*H01L 27/12* (2006.01)

(52) U.S. Cl.
CPC .. *G02F 1/136286* (2013.01); *G02F 1/134309* (2013.01); *H01L 27/124* (2013.01); *G02F 2201/121* (2013.01)

(58) Field of Classification Search
CPC ......... G02F 1/136286; G02F 1/134309; G02F 2201/121; G02F 1/136295; H01L 27/124; G09G 3/3659; G09G 3/3677; G09G 2310/0262; G09G 2300/0426; G09G 2300/0408
See application file for complete search history.

(56) References Cited

U.S. PATENT DOCUMENTS 6,300,987 B1 10/2001 Jung
6,396,555 B1 5/2002 Horie
(Continued)

FOREIGN PATENT DOCUMENTS

CN 105137686 A 12/2015
CN 106950768 A 7/2017
(Continued)

*Primary Examiner* — Mariam Qureshi
(74) *Attorney, Agent, or Firm* — PV IP PC; Wei Te Chung

(57) ABSTRACT

The present invention provides a display panel and a display device. The display panel includes a substrate, sub-pixels, and shared common electrode lines. The sub-pixels are arranged in an array on the substrate, and each sub-pixel includes thin-film transistors. The shared common electrode lines are arranged at intervals on the substrate, and electrically connected to the thin-film transistors. An orthographic projection of each shared common electrode line on the substrate partially overlaps with an orthographic projection of a thin-film transistor on the substrate.

7 Claims, 6 Drawing Sheets

(56) References Cited

U.S. PATENT DOCUMENTS

| | | | | |
|---|---|---|---|---|
| 2016/0320675 A1* | 11/2016 | Lee | ................... | G02F 1/136286 |
| 2018/0217463 A1* | 8/2018 | Guo | ................... | G02F 1/136227 |
| 2021/0405486 A1* | 12/2021 | Zhao | ..................... | G02F 1/1368 |

FOREIGN PATENT DOCUMENTS

| | | | |
|---|---|---|---|
| CN | 107272293 | A | 10/2017 |
| CN | 109298574 | A | 2/2019 |
| CN | 110085190 | A | 8/2019 |
| CN | 110109296 | A | 8/2019 |
| CN | 110928090 | A | 3/2020 |
| CN | 111025803 | A | 4/2020 |
| CN | 113176691 | A | 7/2021 |
| CN | 213750598 | U | 7/2021 |
| IN | 111474789 | A | 7/2020 |

\* cited by examiner

DISPLAY PANEL AND DISPLAY DEVICE

FIELD OF INVENTION

The present invention is related to display technologies, and more particularly, to a display panel and a display device.

BACKGROUND OF INVENTION

Liquid Crystal Display (LCD) has advantages such as low cost and low power consumption and is widely applied in electronic and digital products. An LCD panel usually includes a color filter substrate, thin-film transistor array substrate, and a liquid crystal layer sandwiched between the two substrates. pixel electrodes and common electrodes are respectively configured along inner sides of the two substrates. Then, by applying voltage to alter the directions of liquid crystal molecules, light from the backlight module is refracted to produce images. The driving to the pixel units in the LCD panel is achieved by the gate driving circuit and the source driving circuit respectively engage gate lines (Gate) and data lines (Data).

In the GSS (Gate & S_Com) circuit of the LCD panel, there are numerous places where the gate lines (Gate) and shared common electrode lines (S_Com) cross and overlap with each other. These places are prone to particle effect and electrostatic effect, which would affect the circuit stability of the LCD panel, causing problems like short circuit, etc., influencing the LCD panel's display, and lowering the yield of the LCD panel. In addition, it is difficult to detect or pinpoint the defective part of the GSS circuit through test equipment. The LCD panel has to be scrapped just because of the defective GSS circuit, inevitably increasing the production cost.

SUMMARY OF INVENTION

An objective of the present invention is to provide a display panel and a display device to resolve the problems of low circuit stability, inferior product yield, and high testing difficulty in conventional LCD panels.

To achieve the objective, the present invention provides a display panel, including a substrate, sub-pixels, shared common electrode lines, gate lines, and data lines. The sub-pixels are arranged in an array on the substrate, each including a number of thin-film transistors. The shared common electrode lines are at intervals on the substrate running along a second direction electrically connected to the thin-film transistors. An orthographic projection of each shared common electrode line on the substrate partially overlaps with an orthographic projection of a thin-film transistor on the substrate. The gate lines are at intervals on the substrate running along a first direction, and each gate line is electrically connected to a row of sub-pixels immediately adjacent to the gate line. The data lines are at intervals on the substrate running along the second direction electrically connected to the thin-film transistors. Each data line is between every two immediately adjacent shared common electrode lines The first direction and the second direction are perpendicular.

Specifically, each sub-pixel comprises a first thin-film transistor electrically connected to a gate line and a data line; and a second thin-film transistor electrically connected to the gate line and a shared common electrode line.

Specifically, the shared common electrode line and the second thin-film transistors have a zero-horizontal distance.

Specifically, each sub-pixel further comprises a first pixel electrode configured to a side of the gate line, and a second pixel electrode configured to another side of the gate line away from the side where the first pixel electrode is located; the first pixel electrode is electrically connected to the first thin-film transistor; and the second pixel electrode is electrically connected to the first thin-film transistor and the second thin-film transistor.

Specifically, the first pixel electrode has an area smaller than that of the second pixel electrode.

Specifically, each shared common electrode line comprises a first wire, a second wire, and a third wire; the first wire corresponds to the first pixel electrode; the second wire corresponds to the second pixel electrode; and the third wire is between the first wire and the second wire, and electrically connected to the second thin-film transistor.

Specifically, an orthographic projection of the first wire on the first pixel electrode overlaps a vertical bisector line of the first pixel electrode; and an orthographic projection of the second wire on the second pixel electrode overlaps a vertical bisector line of the second pixel electrode.

Specifically, an orthographic projection of each thin-film transistor on the substrate overlaps an orthographic projection of a gate line on the substrate.

Specifically, each first pixel electrode and each second pixel electrode are enclosed by a plurality of common electrode lines.

The present invention also teaches a display device including the above-described display panel.

The advantage of the present invention lies in that, by integrating the main trunks and branches of the shared common electrode lines together and connecting the thin-film transistors directly to the main trunks of the shared common electrode lines, there are fewer branches from the shared common electrode lines and the number of crossing between the shared common electrode lines and gate lines is reduced. The possibility of circuit defect due to the particle effect and electrostatic effect at the crossings is also reduced. Therefore, the circuit stability, production yield, and inspection difficulty of the display panel are all enhanced.

DESCRIPTION OF DRAWINGS

In order to more clearly illustrate the embodiments of the present invention or prior art, the following figures that will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Figure 1:
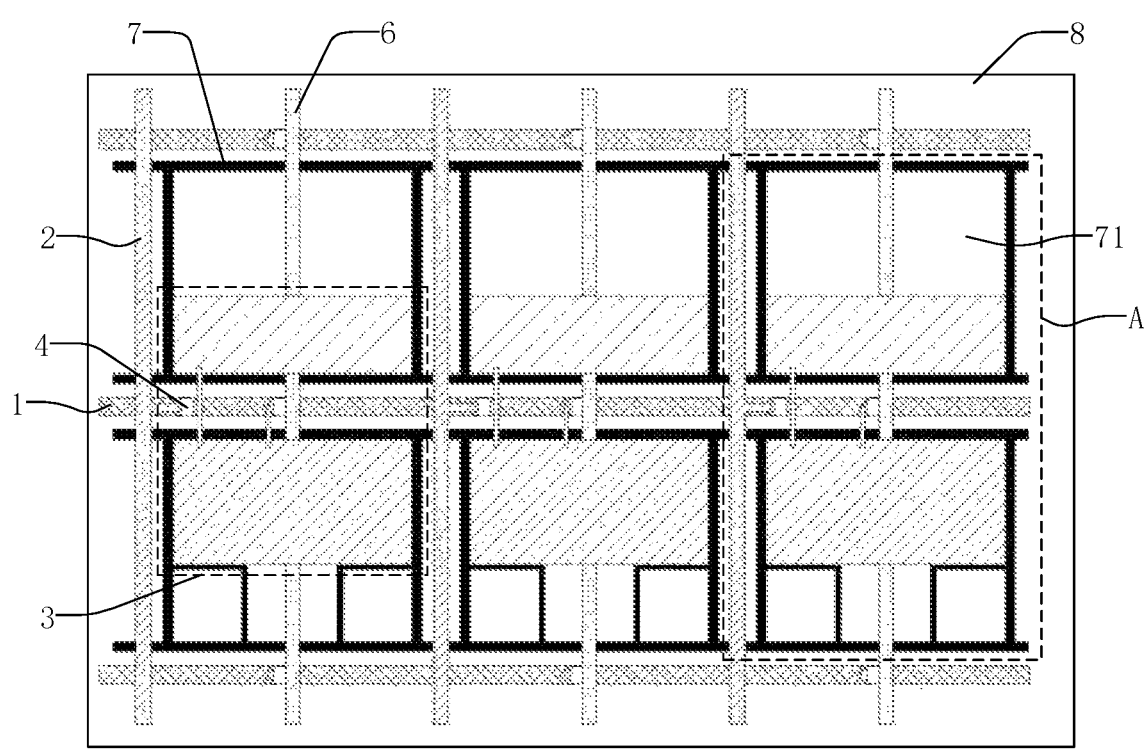
FIG. 1 is a schematic planar diagram showing a display panel according to embodiment 1 of the present invention.

Below are preferred embodiments of the present invention, which prove the enforceability of the present invention, and teach the present invention thoroughly to people skilled in the related art so that the technical content of the present invention is clearer and easier to understand. However, these embodiments do not limit the scope of the present invention. Any equivalent amendments within the spirit and principles of the embodiment described below should be covered by the protected scope of the invention.

In the accompanied drawings, same components are denoted by same reference numbers, and similar components are denoted by similar reference numbers. The dimensions and thickness of the components shown in the drawing do not up to their scales. The present invention does not limit these components to be of specific dimensions or thickness. For better readability, the thickness of some components are exaggerated.

The terms "first, "second," etc. used in the detailed description and claims are for differentiating similar components and are not intended to specify specific order and priority. It should be understood that these components are interchangeable under certain conditions. In addition, the terms like "include," "have," and their variants are non-exclusive.

In the following description, it should be pointed out that the terms such as "arrange," "configure," "connect," etc., unless otherwise specified, should be interpreted in their broadest meaning. For example, "connection" can mean fixed connection, detachable connection, integral connection, mechanical connection, electrical connection, or signal connection; it may also mean direction connection or indirect connection through some intermediate medium; it may also means some internally or externally interaction between two components. For persons of ordinary skill in the art, they can interpret these terms according to their specific circumstances.

Embodiment 1

As shown in FIG. 1, the present embodiment teaches a display panel which includes a substrate 8, a number of gate lines 1, a number of data lines 2, a number of sub-pixels 3, a number of shared common electrode lines (S_Com) 6, and a number of common electrode lines (A_Com) 7.

The substrate 8 may be a hard substrate or a flexible substrate. If the substrate 8 is a hard substrate, it is a glass substrate, quartz substrate, etc. If the substrate 8 is a flexible substrate, it may be made of materials including polyimide (PI).

The sub-pixels 3 are arranged in an array on the substrate 8, and are electrically connected to the gate lines 1, the data lines 2, and the shared common electrode lines 6. The gate lines 1 and the data lines 2 cross but are insulated from each other on the substrate 8 to form a grid-like structure. Specifically, the gate lines 1 run along a first direction at intervals on the substrate, and the data lines 2 run along a second direction at intervals on the substrate 8. A data line 2 is between every two immediately adjacent columns of sub-pixels 3. The shared common electrode lines 6 are parallel to the data lines 2, and a shared common electrode line 6 is between every two immediately adjacent data lines 2. The gate lines 1 are scanned line by line so as to turn on the sub-pixels 3 row by row while display signals are provided through the data lines 2, thereby displaying an image.

The first direction and the second direction are perpendicular. In the present embodiment, the first direction is the horizontal direction, and the second direction is the vertical direction.

Figure 2:
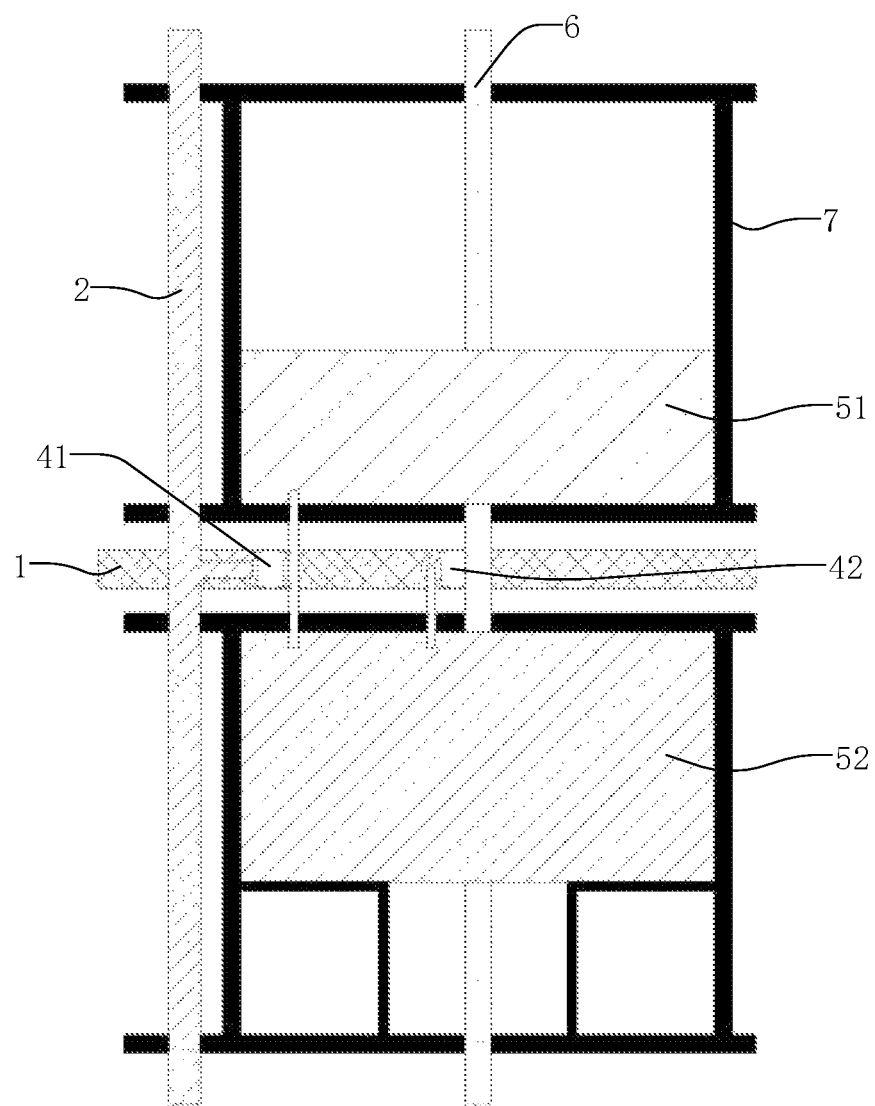
FIG. 2 is a schematic enlarged diagram showing the display panel within the dashed box A of FIG. 1.

As shown in FIG. 2, each sub-pixel 3 includes two thin-film transistors 4 and two pixel electrodes.

Figure 3:
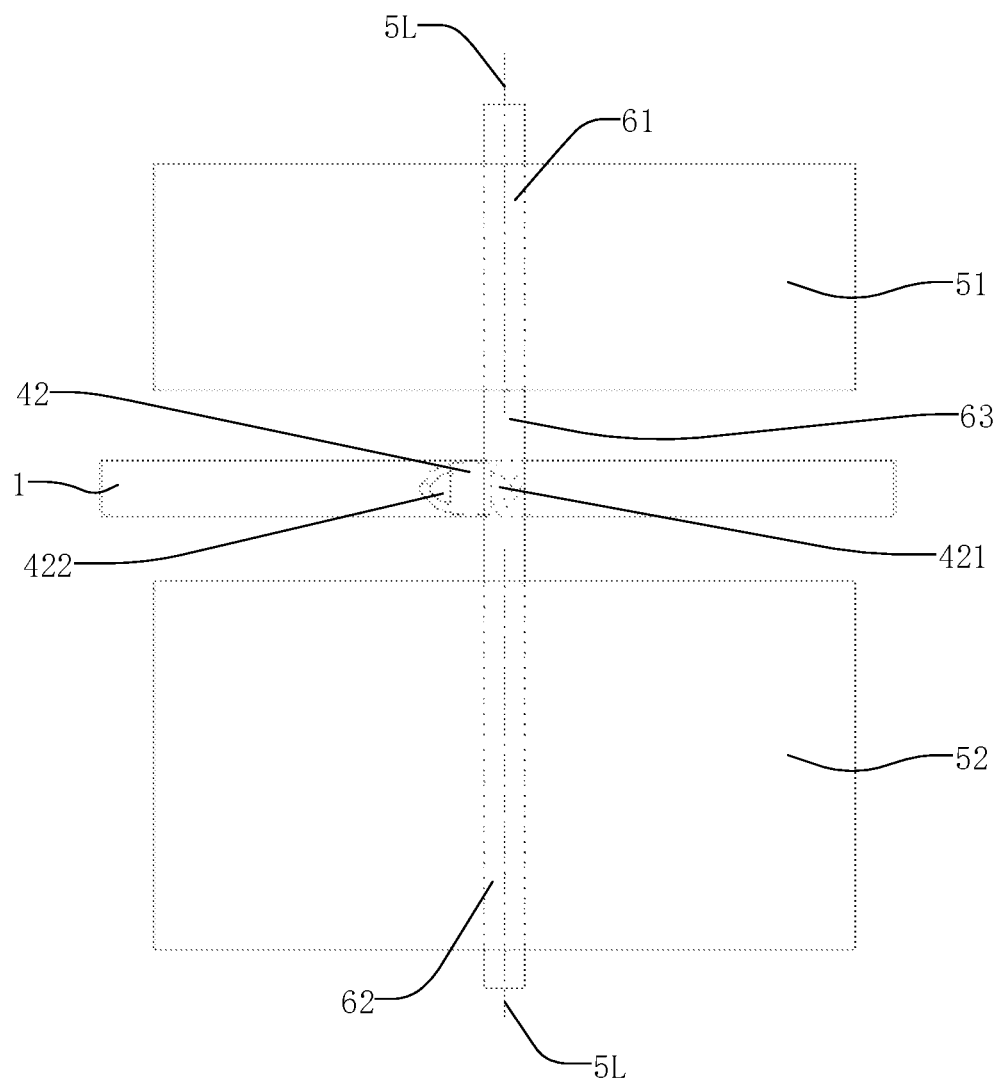
FIG. 3 is a schematic planar diagram showing a portion of the display panel of embodiment 1 of the present invention.

The thin-film transistors 4 includes a first thin-film transistor 41 and a second thin-film transistor 42. The orthographic projection of the first thin-film transistors 41 and the second thin-film transistors 42 on the substrate 8 overlaps the orthographic projection of a gate line 1 on the substrate 8. The first thin-film transistor 41 has a first gate, a first source, and a first drain. The first gate is electrically connected to a gate line 1, the first source is electrically connected to a data line 2. The second thin-film transistor 42 has a second gate, a second source 421, and a second drain 422. As shown in FIG. 3, the second gate is electrically connected to a gate line 1, and the second source 421 is electrically connected to a shared common electrode line 6.

As shown in FIG. 2, the pixel electrodes include a first pixel electrode 51 and a second pixel electrode 52. The first pixel electrode 51 has an area smaller than that of the second pixel electrode 52. Specifically, the first pixel electrode 51 may be a 4-domain pixel electrode, and the second pixel electrode 52 may be an 8-domain pixel electrode. The first pixel electrode 51 is configure to a side to a gate line 1, and the second pixel electrode 52 is configured to another side of the gate line 1 away from the side where the first pixel electrode 51 is located. The first thin-film transistor 41 and the second thin-film transistor 42 are positioned between the first pixel electrode 51 and the second pixel electrode 52. The first pixel electrode 51 is electrically connected to the first drain of the first thin-film transistor 41. As shown in FIG. 3, the second pixel electrode 52 is electrically connected to the first drain of the first thin-film transistor 41 and the second drain 422 of the second thin-film transistor 42.

The gate lines 1, through the first thin-film transistors 41, control the ON and OFF of the first pixel electrodes 51 and the second pixel electrodes 52, which in turn control the display of the sub-pixels 3. The shared common electrode lines 6, through the second thin-film transistors 42, cause different voltages respectively applied to the second pixel electrodes 52 and the first pixel electrodes 51, thereby providing different liquid crystal deflection angles for those corresponding to the first pixel electrodes 51 and those corresponding to the second pixel electrodes 52, increasing the viewing angle of the display panel, and enhancing the display quality of the display panel.

As shown in FIG. 3, each shared common electrode line 6 includes a first wire 61, a second wire 62, and a third wire 63. The first wire 61 corresponds to a first pixel electrode 51, and the orthographic projection of the first wire 61 on the substrate 8 overlaps a vertical bisector line 5L of the first pixel electrode 51. The second wire 62 corresponds to a second pixel electrode 52, and the orthographic projection of the second wire 62 on the substrate 8 overlaps the vertical bisector line 5L of the second pixel electrode 52. The third wire 63 is between the first wire 61 and the second wire 62, and electrically connects the first wire 61 and the second wire 62 to a second thin-film transistor 42.

The third wire 63 is a straight line, and has a first terminal, a second terminal, and a third terminal. The first terminal is electrically connected to the first wire 61. The second terminal is electrically connected to the second wire 62. The third terminal is between the first terminal and the second terminal and is electrically connected to the second drain 422 of the second thin-film transistor 42.

The third terminal and the second drain 422 have a zero horizontal distance in between. Therefore, the orthographic projection of third wire 63 of the shared common electrode line 6 on the substrate 8 partially overlaps the orthographic projection of the second thin-film transistor 42 on the substrate 8, causing the second thin-film transistor 42 directly and electrically connects the main trunks of the shared common electrode line 6, and reducing branches from the shared common electrode line 6. As such, there are fewer crossings between the shared common electrode lines 6 and the gate lines 1, thereby avoiding potential circuit defect that may be resulted from the particle effect and electrostatic effect at the crossings and, as such, reducing production cost.

As shown in FIG. 1, the gate lines 1 vertically separate the first pixel electrodes 51 and the second pixel electrodes 52 of the sub-pixels 3. The common electrode lines 7 are configured between immediately adjacent two gate lines 1, and form a number of horizontally connected II-shaped wires. Each II-shaped wire encloses an electrode area 71. The first pixel electrodes 51 and the second pixel electrodes 52 of the sub-pixels 3 are respectively positioned within the electrode areas 71 at the two sides of the gate lines 1.

The present embodiment also teaches a display device which includes the above-described display panel. The display panel presents images for the display device. The display device may be any electronic appliance or component having a display function, such as a mobile phone, a notebook computer, or a television.

The display panel and the display device taught by the present invention integrate the main trunks and branches of the shared common electrode lines together, and the thin-film transistors, originally connected to the branches of the shared common electrode lines in the prior art, is now directly and electrically connected to the main trunks of the shared common electrode lines. As such, there are fewer branches from the shared common electrode lines and, compared to the prior art, the number of crossings between the shared common electrode lines and gate lines is reduced by at least a half. The possibility of circuit defect due to the particle effect and electrostatic effect at the crossings is also reduced. Therefore, the circuit stability, production yield, and inspection difficulty of the display panel are all enhanced.

Embodiment 2

Figure 4:
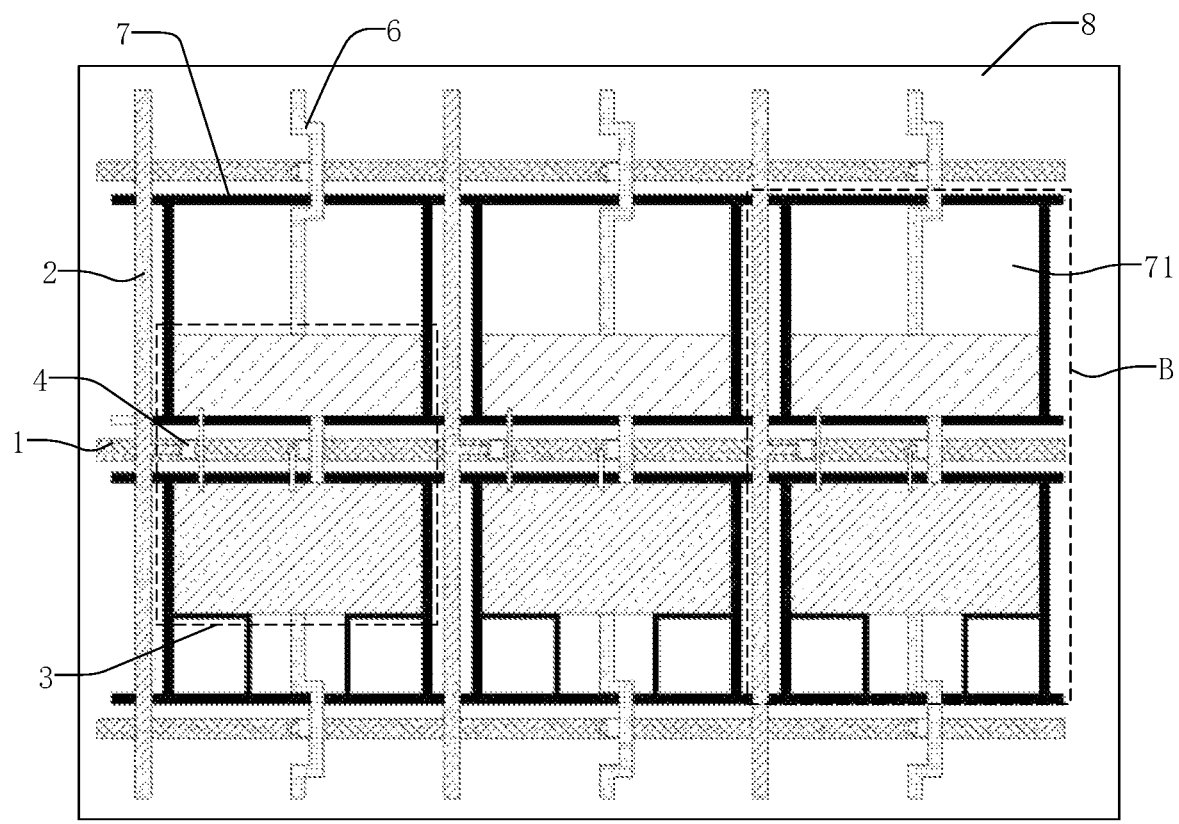
FIG. 4 is a schematic planar diagram showing a display panel according to embodiment 2 of the present invention.

As shown in FIG. 4, the present embodiment teaches a display panel which includes a substrate 8, a number of gate lines 1, a number of data lines 2, a number of sub-pixels 3, a number of shared common electrode lines (S_Com) 6, and a number of common electrode lines (A_Com) 7.

The substrate 8 may be a hard substrate or a flexible substrate. If the substrate 8 is a hard substrate, it is a glass substrate, quartz substrate, etc. If the substrate 8 is a flexible substrate, it may be made of materials including polyimide (PI).

The sub-pixels 3 are arranged in a array on the substrate 8, and are electrically connected to the gate lines 1, the data lines 2, and the shared common electrode lines 6. The gate lines 1 and the data lines 2 cross but are insulated from each other on the substrate 8 to form a grid-like structure. Specifically, the gate lines 1 run along a first direction at intervals on the substrate, and the data lines 2 run along a second direction at intervals on the substrate 8. A data line 2 is between every two immediately adjacent columns of sub-pixels 3. The shared common electrode lines 6 are parallel to the data lines 2, and a shared common electrode line 6 is between every two immediately adjacent data lines 2. The gate lines 1 are scanned line by line so as to turn on the sub-pixels 3 row by row while display signals are provided through the data lines 2, thereby displaying an image.

The first direction is the horizontal direction, and the second direction is the vertical direction.

Figure 5:
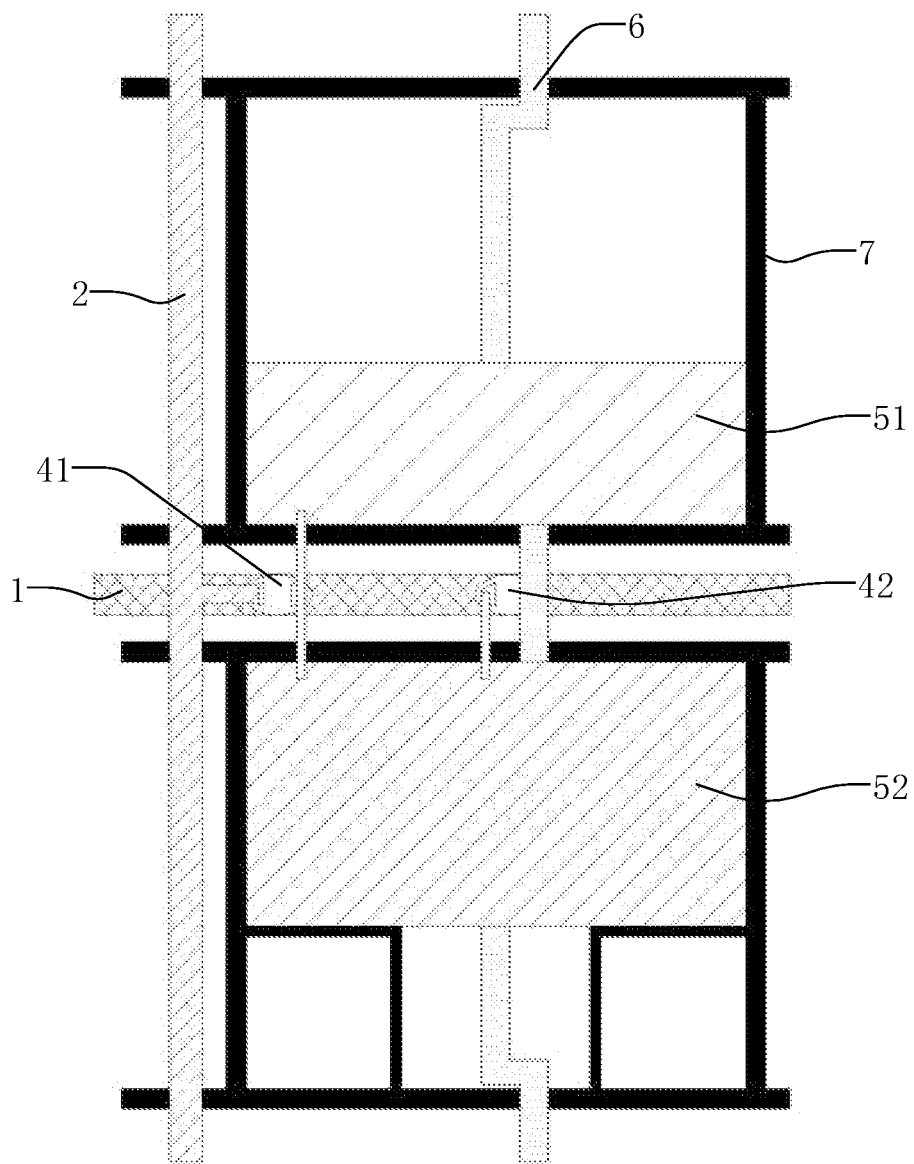
FIG. 5 is a schematic enlarged diagram showing the display panel within the dashed box B of FIG. 3.

As shown in FIG. 5, each sub-pixel 3 includes thin-film transistors 4 and pixel electrodes.

Figure 6:
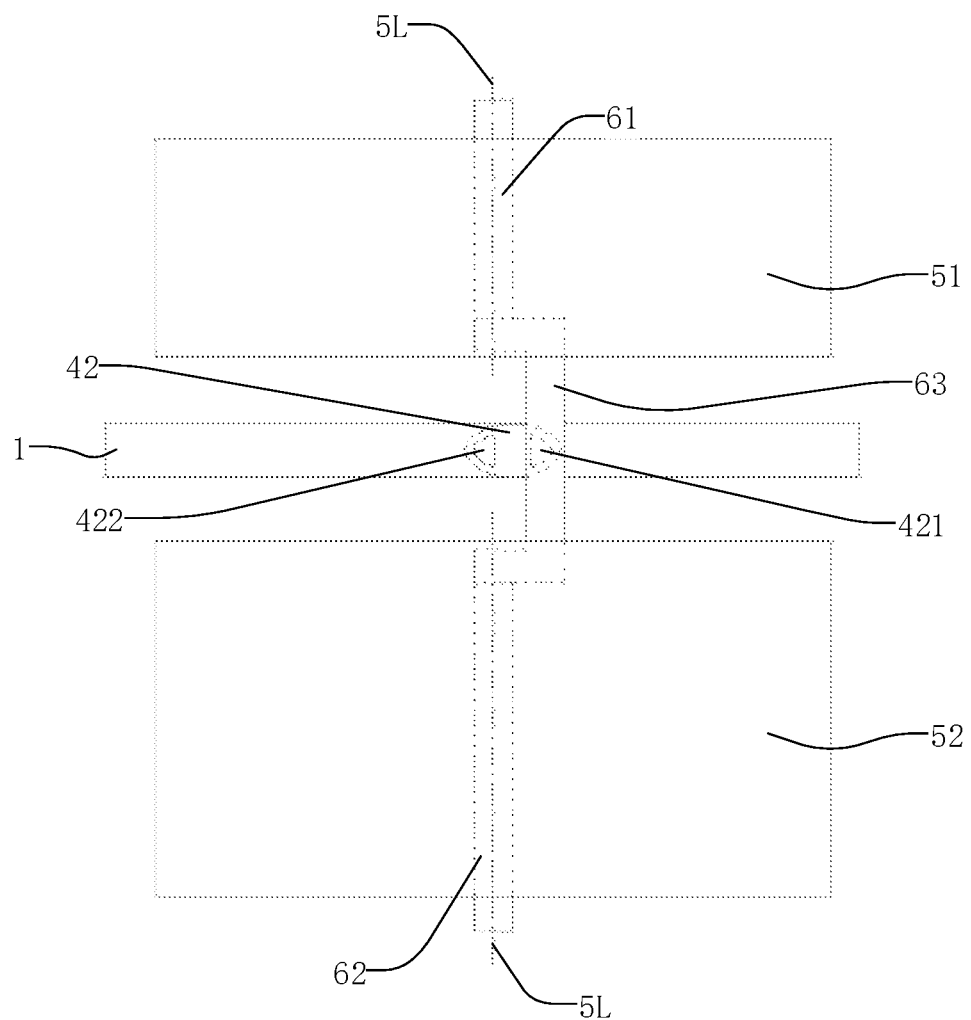
FIG. 6 is a schematic planar diagram showing a portion of the display panel of embodiment 2 of the present invention.

The thin-film transistors 4 includes a first thin-film transistor 41 and a second thin-film transistor 42. The orthographic projection of the first thin-film transistors 41 and the second thin-film transistors 42 on the substrate 8 overlaps the orthographic projection of a gate line 1 on the substrate 8. The first thin-film transistor 41 has a first gate, a first source, and a first drain. The first gate is electrically connected to a gate line 1, the first source is electrically connected to a data line 2. The second thin-film transistor 42 has a second gate, a second source 421, and a second drain 422. As shown in FIG. 6, the second gate is electrically connected to a gate line 1, and the second source 421 is electrically connected to a shared common electrode line 6.

As shown in FIG. 5, the pixel electrodes include a first pixel electrode 51 and a second pixel electrode 52. The first pixel electrode 51 has an area smaller than that of the second pixel electrode 52. Specifically, the first pixel electrode 51 may be a 4-domain pixel electrode, and the second pixel electrode 52 may be an 8-domain pixel electrode. The first pixel electrode 51 is configure to a side to a gate line 1, and the second pixel electrode 52 is configured to another side of the gate line 1 away from the side where the first pixel electrode 51 is located. The first thin-film transistor 41 and the second thin-film transistor 42 are positioned between the first pixel electrode 51 and the second pixel electrode 52. The first pixel electrode 51 is electrically connected to the first drain of the first thin-film transistor 41. As shown in FIG. 3, the second pixel electrode 52 is electrically connected to the first drain of the first thin-film transistor 41 and the second drain 422 of the second thin-film transistor 42.

The gate lines 1, through the first thin-film transistors 41, control the ON and OFF of the first pixel electrodes 51 and the second pixel electrodes 52, which in turn control the display of the sub-pixels 3. The shared common electrode lines 6, through the second thin-film transistors 42, cause different voltages respectively applied to the second pixel electrodes 52 and the first pixel electrodes 51, thereby providing different liquid crystal deflection angles for those corresponding to the first pixel electrodes 51 and those corresponding to the second pixel electrodes 52, increasing the viewing angle of the display panel, and enhancing the display quality of the display panel.

As shown in FIG. 6, each shared common electrode line 6 includes a first wire 61, a second wire 62, and a third wire 63. The first wire 61 corresponds to a first pixel electrode 51, and the orthographic projection of the first wire 61 on the substrate 8 overlaps a vertical bisector line 5L of the first pixel electrode 51. The second wire 62 corresponds to a second pixel electrode 52, and the orthographic projection of the second wire 62 on the substrate 8 overlaps the vertical bisector line 5L of the second pixel electrode 52. The third wire 63 is between the first wire 61 and the second wire 62, and electrically connects the first wire 61 and the second wire 62 to a second thin-film transistor 42.

The third wire 63 may have a "]" or "[" shape. Specifically, the third wire 63 in the present embodiment has a]" shape. The third wire 63 has a first terminal, a second terminal, and a third terminal. The first terminal is electrically connected to the first wire 61. The second terminal is electrically connected to the second wire 62. The third terminal is configured in a middle section of the third wire 63, and is electrically connected to the second drain 422 of the second thin-film transistor 42.

The third terminal and the second drain 422 have a zero horizontal distance in between. Therefore, the orthographic projection of third wire 63 of the shared common electrode line 6 on the substrate 8 partially overlaps the orthographic projection of the second thin-film transistor 42 on the substrate 8, causing the second thin-film transistor 42 directly and electrically connects the main trunks of the shared common electrode line 6, and reducing branches from the shared common electrode line 6. As such, there are fewer crossings between the shared common electrode lines 6 and the gate lines 1, thereby avoiding potential circuit defect that may be resulted from the particle effect and electrostatic effect at the crossings.

As shown in FIG. 4, the gate lines 1 vertically separate the first pixel electrodes 51 and the second pixel electrodes 52 of the sub-pixels 3. The common electrode lines 7 are configured between immediately adjacent two gate lines 1, and form a number of horizontally connected II-shaped wires. Each II-shaped wire encloses an electrode area 71. The first pixel electrodes 51 and the second pixel electrodes 52 of the sub-pixels 3 are respectively positioned within the electrode areas 71 at the two sides of the gate lines 1.

The present embodiment also teaches a display device which includes the above-described display panel. The display panel presents images for the display device. The display device may be any electronic appliance or component having a display function, such as a mobile phone, a notebook computer, or a television.

The display panel and the display device taught by the present invention integrate the main trunks and branches of the shared common electrode lines together, and the thin-film transistors, originally connected to the branches of the shared common electrode lines in the prior art, is now directly and electrically connected to the main trunks of the shared common electrode lines. As such, there are fewer branches from the shared common electrode lines and, compared to the prior art, the number of crossing between the shared common electrode lines and gate lines is reduced by at least a half. The possibility of circuit defect due to the particle effect and electrostatic effect at the crossings is also reduced. Therefore, the circuit stability, production yield, and inspection difficulty of the display panel are all enhanced.

Above are embodiments of the present invention, which are for explaining the operation principle and exemplary application of the present invention. They do not limit the scope of the present invention and any equivalent amendments within the spirit and principles of the embodiment described above should be covered by the protected scope of the invention.

What is claimed is:

1. A display panel, comprising:
a substrate;
a plurality of sub-pixels arranged in an array on the substrate, wherein each sub-pixel comprises a plurality of thin-film transistors;
a plurality of shared common electrode lines disposed at intervals on the substrate along a second direction and electrically connected to the thin-film transistors, wherein an orthographic projection of each shared common electrode line on the substrate partially overlaps with an orthographic projection of a thin-film transistor on the substrate, the shared common electrode lines extend along a first direction;
a plurality of gate lines disposed at intervals on the substrate along the first direction, wherein each gate line is electrically connected to a row of the sub-pixels adjacent to the gate line, and each gate line and each shared common electrode line are disposed in different layers; and
a plurality of data lines disposed at intervals on the substrate along the second direction, wherein the shared common electrode lines and the data lines are alternately arranged along the second direction, establishing an array of the shared common electrode lines and the data lines, wherein each data line, except for those positioned at outermost edges of the array of the shared common electrode lines and the data lines, is disposed between every two adjacent shared common electrode lines;
wherein the first direction and the second direction are perpendicular to each other,
wherein each sub-pixel comprises a first thin-film transistor and a second thin-film transistor, the first thin-film transistor and the second thin film transistor of each sub-pixel is electrically connected to the same one gate line, the first thin-film transistor of each sub-pixel is electrically connected to one of the data lines, and the second thin-film transistor of each sub-pixel is electrically connected to one of the shared common electrode lines,
wherein each shared common electrode line has a zero-horizontal distance from a source and a drain of the second thin-film transistor connected to this shared common electrode line,
wherein each sub-pixel further comprises a first pixel electrode disposed at one side of the gate line and electrically connected to the first thin-film transistor and a second pixel electrode disposed at another side of the gate line away from the side where the first pixel electrode is located and electrically connected to the first thin-film transistor and the second thin-film transistor,
wherein each of the shared common electrode lines extends continuously along the first direction across the first pixel electrode and the second pixel electrode.

2. The display panel according to claim 1, wherein an area of the second pixel electrode is smaller than an area of the first pixel electrode.

3. The display panel according to claim 1, wherein each shared common electrode line comprises a first wire corresponding to the first pixel electrode, a second wire corresponding to the second pixel electrode, and a third wire connected to the first wire and the second wire and electrically connected to the second thin-film transistor.

4. The display panel according to claim 3, wherein an orthographic projection of the first wire on the first pixel electrode corresponds a vertical bisector line of the first pixel electrode, and an orthographic projection of the second wire on the second pixel electrode corresponds a vertical bisector line of the second pixel electrode.

5. The display panel according to claim 1, wherein an orthographic projection of each thin-film transistor on the substrate overlaps an orthographic projection of a gate line on the substrate.

6. The display panel according to claim 1, further comprising common electrode lines enclosing the first pixel electrodes and the second pixel electrodes.

7. A display device, comprising the display panel according to claim 1.

* * * * *